United States Patent
Chu et al.

(10) Patent No.: US 10,966,344 B2
(45) Date of Patent: Mar. 30, 2021

(54) MOUNTING APPARATUS AND HEAT DISSIPATING DEVICE USING THE SAME

(71) Applicant: NANNING FUGUI PRECISION INDUSTRIAL CO., LTD., Nanning (CN)

(72) Inventors: Wei-Sin Chu, New Taipei (TW); Huan-Ze Lin, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 97 days.

(21) Appl. No.: 16/231,994

(22) Filed: Dec. 25, 2018

(65) Prior Publication Data
US 2020/0205314 A1    Jun. 25, 2020

(51) Int. Cl.
*H05K 7/20* (2006.01)
*F16F 15/04* (2006.01)
*F16M 13/02* (2006.01)

(52) U.S. Cl.
CPC ......... *H05K 7/20172* (2013.01); *F16F 15/04* (2013.01); *F16M 13/02* (2013.01); *H05K 7/20736* (2013.01); *F16M 2200/02* (2013.01)

(58) Field of Classification Search
CPC .......... H05K 7/20172; H05K 7/20554; H05K 7/20718; H05K 7/20581; H05K 7/20736; F16F 15/04; F16M 13/02; F28F 2280/10; F28F 2280/02; F28F 2280/00
See application file for complete search history.

(56) References Cited

U.S. PATENT DOCUMENTS

| | | | | |
|---|---|---|---|---|
| 5,927,389 A * | 7/1999 | Gonsalves | ......... | H05K 7/20172 165/121 |
| 8,322,974 B2 * | 12/2012 | Chen | ............. | F04D 29/668 415/119 |
| 2004/0201962 A1 * | 10/2004 | Lao | ............. | G06F 1/186 361/695 |
| 2011/0135448 A1 | 6/2011 | Chen | | |
| 2012/0114461 A1 * | 5/2012 | Chen | ............. | F04D 29/601 415/119 |
| 2012/0326002 A1 * | 12/2012 | Li | ............. | G06F 1/183 248/672 |

FOREIGN PATENT DOCUMENTS

| | | |
|---|---|---|
| CN | 2816439 Y | 9/2006 |
| CN | 101240807 A | 8/2008 |
| CN | 202433821 U | 9/2012 |
| CN | 103906414 A | 7/2014 |
| TW | I494043 | 7/2015 |
| WO | WO-2014106898 A1 * | 7/2014 ......... H05K 7/20172 |

* cited by examiner

*Primary Examiner* — Tho V Duong
(74) *Attorney, Agent, or Firm* — ScienBiziP, P.C.

(57) ABSTRACT

A heat dissipation device which is effectively vibration-free in relation to its host includes a fan, an enclosure, and a mounting apparatus. The mounting apparatus includes a receiving bracket for receiving the fan, a locking member, and a vibration-absorbing member slidably mounted to the enclosure. The receiving bracket has a locating member corresponding to the locating slot. The locating member is locked, and the vibration absorbing member abuts against a side of the receiving bracket, receiving and not transmitting the vibrations of a cooling fan.

16 Claims, 3 Drawing Sheets

MOUNTING APPARATUS AND HEAT DISSIPATING DEVICE USING THE SAME

FIELD

The subject matter herein generally relates to temperature control.

BACKGROUND

Heat dissipating devices perform the critical function of removing heat from a computer system. The heat dissipating device can include one or more fans received in a bracket. For example, in a server system, a plurality of fans are provided to efficiently dissipate heat. The fans are secured to a bracket, and the bracket is mounted in a server enclosure. When the server system is running, vibration generated by the fans is transferred to the server enclosure and the bracket and the server can be adversely affected by the vibration.

Therefore, there is room for improvement in the art.

BRIEF DESCRIPTION OF THE DRAWINGS

Embodiments of the present disclosure will now be described, with reference to the attached figures.

DETAILED DESCRIPTION

Figure 1:
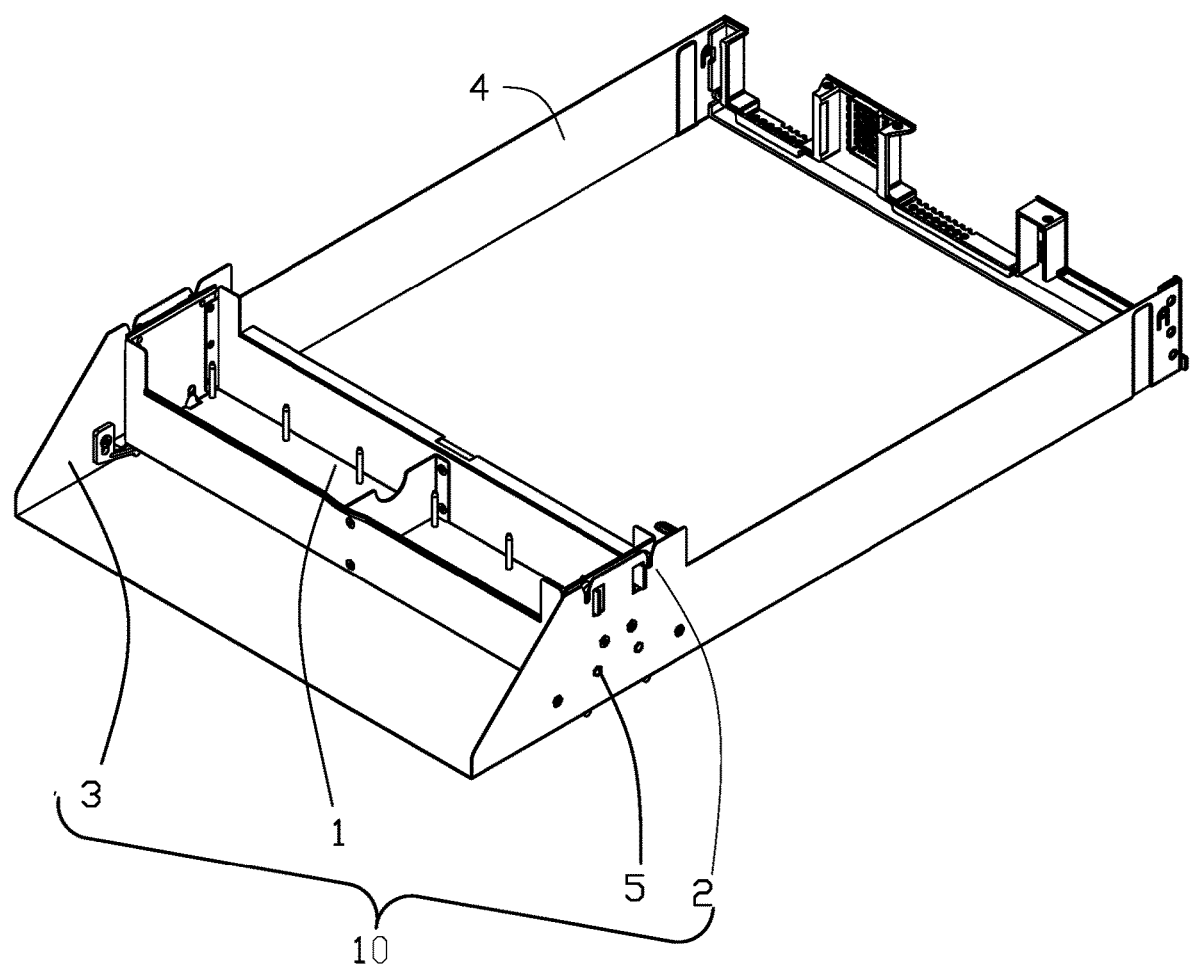
FIG. 1 is an isometric view of a heat dissipating device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like.

FIG. 1 illustrates a heat dissipation device 100.

The heat dissipation device 100 includes a fan (not shown), an enclosure 4, and a mounting apparatus 10. The mounting apparatus 10 is used to mount the fan to the enclosure 4.

Figure 2:
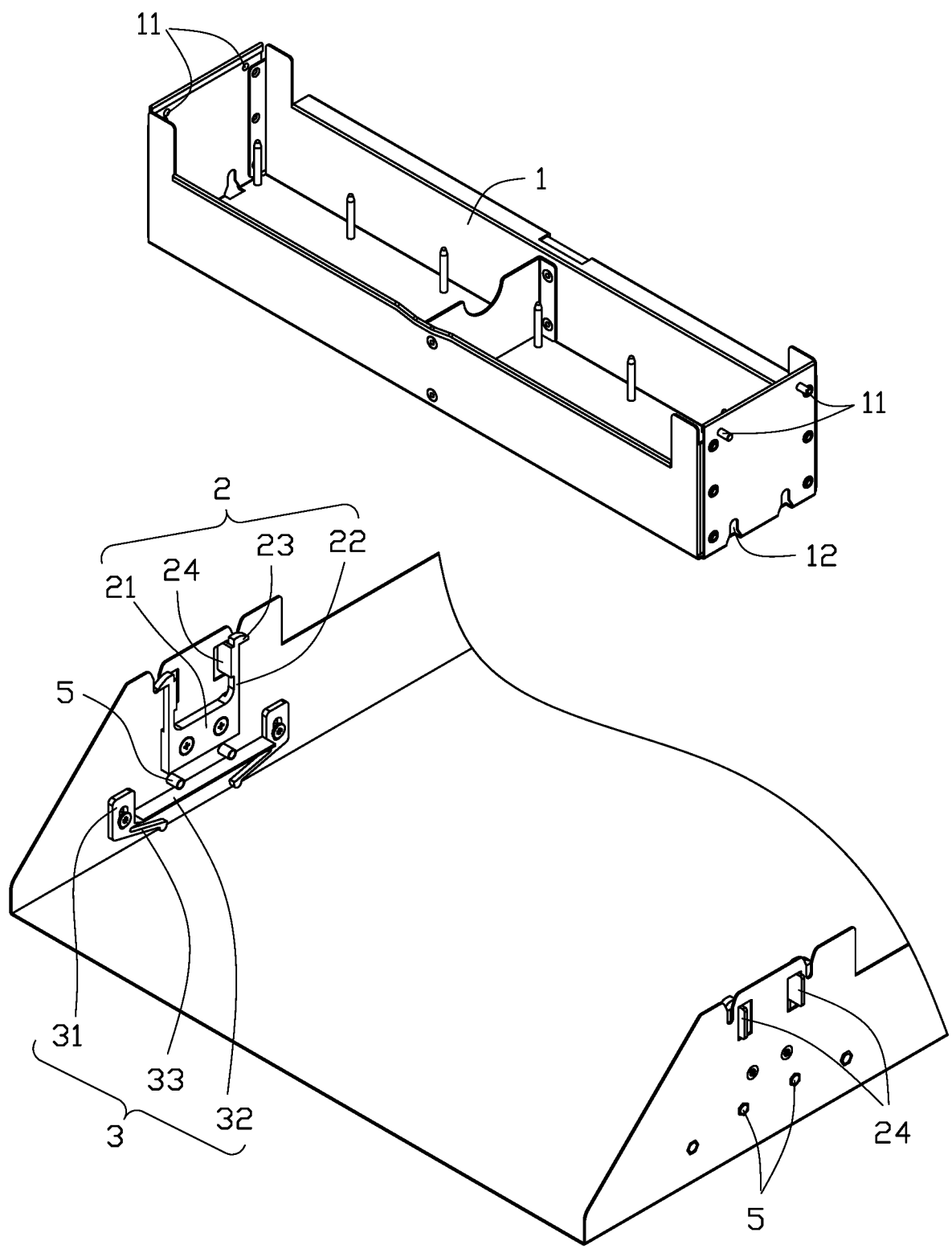
FIG. 2 is an exploded view of a mounting apparatus of the heat dissipating device of FIG. 1.
Figure 3:
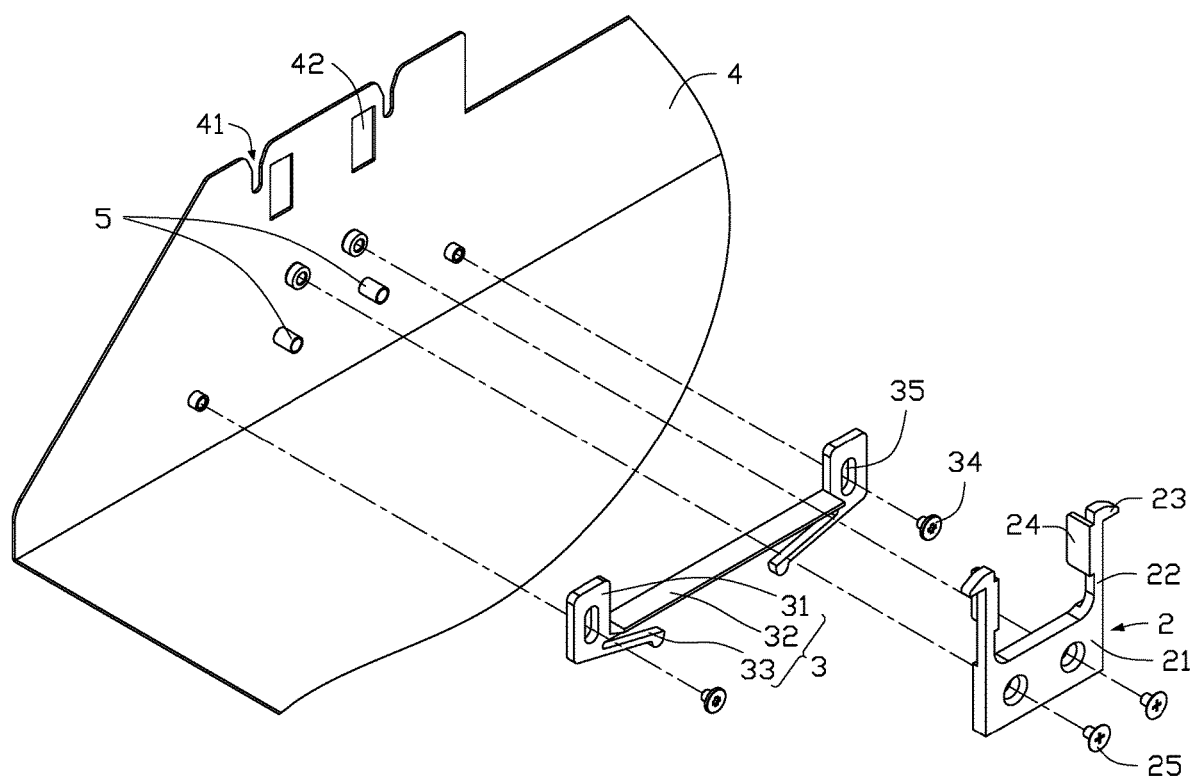
FIG. 3 is a view of part of the mounting apparatus of FIG. 2.

Referring also to FIGS. 2-3, the enclosure 4 defines a locating slot 41.

The mounting apparatus 10 includes a receiving bracket 1, a locking member 2, a vibration absorbing member 3, and a guiding member 5.

The receiving bracket 1 is used to receive the fan, and the receiving bracket 1 includes a positioner 11 corresponding to the locating slot 41.

The locking member 2 is mounted to the enclosure 4. The vibration absorbing member 3 is slidably mounted to the enclosure 4.

The positioner 11 is locked within the locating slot 41 by the locking member 2, and the vibration absorbing member 3 locates under the locking member 2 and abuts against a side of the receiving bracket 1. The vibration absorbing member 3 is used to absorb vibration caused by the fan in the receiving bracket 1.

In one embodiment, the locking member 2 include a first mounting portion 21, two connecting rods 22, two latching portions 23, and two unlatching portions 24. Each connecting rod 22 is located between the first mounting portion 21 and the latching portion 23.

The locking member 2 can be made of elastic materials, and the locking member 2 can be fixed to a side wall of the enclosure 4 by a first fastening member 25.

For example, the first mounting portion 21, the two connecting rods 22, the two latching portions 23 and the two unlatching portions 24 can be integrally formed. The first fastening member 25 can be a screw, and the first fastening member 25 secures the first mounting portion 21 to an inner side of a side wall of the enclosure 4.

The two connecting rods 22 can be respectively and perpendicularly connected to two opposite ends of the first mounting portion 21, and the two latching portions 23 are respectively and perpendicularly connected to an end of a corresponding connecting rod 22, the two latching portions 23 are substantially parallel to the first mounting portion 21.

Each of the two unlatching portions 24 can be a strip coupled to a middle portion of a corresponding connecting rod 22 and extends away from the receiving bracket 1. The enclosure 4 defines two through holes 42 corresponding to the two unlatching portions 24. The two unlatching portions 24 protrude out of the enclosure 4 via the two through holes 42.

Each of the two latching portions 23 locates over the locating slot 41 and latches an opening of the locating slot 41. An upper surface of the latching portion 23 is substantially arc-shaped, and an end of the latching portion 23 near the locking member 2 is higher than an end of the latching portion 23 away from the locking member 2.

When the receiving bracket 1 is needed to be installed to the enclosure 4, two opposite ends of the receiving bracket 1 can be pressed and the positioner 11 is driven to abut against the upper surface of the latching portion 23, the connecting rod 22 is elastically deformed and the locking member 2 releases the opening of the locating slot 41. The positioner 11 is thus able to enter into the locating slot 41. When the connecting rod 22 restores under restoring force, the latching portion restores by driven by the connecting rod 22 and latches the opening of the locating slot 41, the positioner 11 is latched within the locating slot, thus the locking member 2 locks the positioner 11 within the locating slot 41.

The unlatching portion 24 includes one end fixed to the connecting rod 22, and the other end of the unlatching portion 24 protrudes out of the enclosure 4 via a through hole 42 defined in the enclosure 4.

When the positioner 11 is to be uninstalled from the enclosure 4, the unlatching portion 24 can be manually operated, and the unlatching portion 24 deforms the connecting rod 22 and the locking member 2 releases the opening of the locating slot 41. Thereby, the positioner 11 is able to move out of the locating slot 41 and the fan can be removed from the enclosure 4.

The vibration absorbing member 3 includes a second mounting portion 31, a supporting portion 32, and a buffering portions 33.

The vibration absorbing member 3 can be made of elastic materials, and the second mounting portion 31, the supporting portion 32, and the buffering portion 33 can be integrally formed.

The supporting portion 32 abuts against a side of the receiving bracket 1.

The second mounting portion 31 is located at an end of the supporting portion 32 and defines a sliding slot 35. The vibration absorbing member 3 is mounted to the enclosure 4 through a second fastening member 34. The second fastening member 34 is movably received in the sliding slot 35, thus vibration absorbing member 3 can be mounted to the enclosure 4 through the second mounting portion 31.

The buffering portion 33 elastically deforms when the vibration absorbing member 3 is driven by the vibration of the receiving bracket 1.

The buffering portion 33 can be fixed to a lower position of the supporting portion 32 and sandwiched between the supporting portion 32 and the enclosure 4. An end portion of the buffering portion 33 extends along an axis of the supporting portion 32.

When the receiving bracket 1 is installed to the enclosure 4, the supporting portion 32 abuts against a bottom of the receiving bracket 1 and latches the receiving bracket 1 in the enclosure 4 together with the locking member 2.

The sliding slot 35 extends perpendicularly to the supporting portion 32. The second fastening member 34 is restricted in the sliding slot 35 and allows the vibration absorbing member 3 to move along the sliding slot 35, thus the vibration absorbing member 3 can absorb the vibration caused by the fan in the receiving bracket 1 by moving along the sliding slot 35 under restrain force.

When the receiving bracket 1 is vibrated by the motion of the fan, the buffering portion 33 is sympathetically deformed, and the buffering portion 33 adaptively supports the receiving bracket 1 under restoring force.

The buffering portion 33 can also be an individual part, for example, a spring or an elastic plunger.

The guiding member 5 is mounted to a side wall of the enclosure 4 and located between the locking member 2 and the vibration absorbing member 3.

When the receiving bracket 1 is installed in the enclosure 4, the guiding member 5 guides the receiving bracket 1 to a predetermined position.

For example, the receiving bracket 1 defines a guiding slot 12 corresponding to the guiding member 5.

When the receiving bracket 1 is installed in the enclosure 4, the guiding member 5 slides along the guiding slot 12 to guide the receiving bracket 1 to the predetermined position, so that the bottom of the receiving bracket 1 can abuts against the supporting portion 32 of the vibration absorbing member 3. The guiding member 5 can be a pillar, such as a screw or a pin, sheathed by rubber.

In one embodiment, the guiding slot 12 can be omitted, and the mounting apparatus 10 includes two guiding members 5. A distance between the two guiding members 5 is similar to a width of the receiving bracket 1. When the receiving bracket 1 is to installed in the enclosure 4, the receiving bracket 1 slides between the two guiding members 5.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A mounting apparatus for mounting a fan to an enclosure, the enclosure defining a locating slot, the mounting apparatus comprising:
   a receiving bracket for receiving the fan and comprising a positioner corresponding to the locating slot;
   a locking member mounted to the enclosure, and comprising:
   a first mounting portion;
   a latching portion; and
   a connecting rod connected between the first mounting portion and the latching portion; and
   a vibration absorbing member slidably mounted to the enclosure;
   wherein the first mounting portion is fixed to a side wall of the enclosure, and the latching portion is coupled to the locating slot,
   wherein the positioner is locked within the locating slot by the locking member, and the vibration absorbing member abuts against a bottom side of the receiving bracket.

2. The mounting apparatus of claim 1, wherein the connecting rod is made of elastic materials;
   when the positioner is driven to push against the latching portion, the connecting rod is elastically deformed and the locking member releases the locating slot, so that the positioner is able to be inserted into the locating slot; and
   when the positioner is inserted into the locating slot, the connecting rod restores, and the locking member locks the positioner within the locating slot.

3. The mounting apparatus of claim 1, wherein the locking member further comprises an unlatching portion having one end fixed to the connecting rod; and another end of the unlatching portion protrudes out of the enclosure via a through hole defined in the enclosure.

4. The mounting apparatus of claim 1, wherein the mounting apparatus further comprises a guiding member; wherein the guiding member is mounted to a side wall of the enclosure and corresponding to the receiving bracket;
   when the receiving bracket is installed to the enclosure, the guiding member guides the receiving bracket to a predetermined position.

5. The mounting apparatus of claim 4, wherein the receiving bracket defines a guiding slot corresponding to the guiding member;
   when the receiving bracket is installed to the enclosure, the guiding member slides along the guiding slot to guide the receiving bracket to the predetermined position.

6. The mounting apparatus of claim 1, wherein the vibration absorbing member comprises a buffering portion;
   when the receiving bracket vibrates together with the fan, the buffering portion is driven to elastically deformed, and the buffering portion adaptively supports the receiving bracket under restoring force.

7. The mounting apparatus of claim 6, wherein the vibration absorbing member further comprises:

a supporting portion abuts against a side of the receiving bracket;

a second mounting portion located at an end of the supporting portion and mounted to the enclosure;

wherein the buffering portion is fixed to the supporting portion and sandwiched between the supporting portion and the enclosure.

8. The mounting apparatus of claim 7, wherein the second mounting portion defines a sliding slot; the vibration absorbing member is mounted to the enclosure through a fastening member; the fastening member is movably received in the sliding slot.

9. A heat dissipation device comprising:

a fan;

an enclosure defining a locating slot; and a mounting apparatus for mounting the fan to the enclosure, the mounting apparatus comprising:

a receiving bracket for receiving the fan and comprising a positioner corresponding to the locating slot;

a locking member mounted to the enclosure, and comprising:

a first mounting portion;

a latching portion; and a connecting rod connected between the first mounting portion and the latching portion; and a vibration absorbing member slidably mounted to the enclosure;

wherein the first mounting portion is fixed to a side wall of the enclosure, and the latching portion is coupled to the locating slot, wherein the member is locked within the locating slot by the locking member, and the vibration absorbing member abuts against a side of the receiving bracket.

10. The heat dissipating device of claim 9, wherein the connecting rod is made of elastic materials;

when the positioner is driven to push against the latching portion, the connecting rod is elastically deformed and the locking member releases the locating slot, so that the positioner is able to be inserted into the locating slot; and when the positioner is inserted into the locating slot, the connecting rod restores, and the locking member locks the positioner within the locating slot.

11. The heat dissipating device of claim 9, wherein the locking member further comprises an unlatching portion having one end fixed to the connecting rod; and another end of the unlatching portion protrudes out of the enclosure via a through hole defined in the enclosure.

12. The heat dissipating device of claim 9, wherein the mounting apparatus further comprises a guiding member; wherein the guiding member is mounted to a side wall of the enclosure and corresponding to the receiving bracket;

when the receiving bracket is installed to the enclosure, the guiding member guides the receiving bracket to a predetermined position.

13. The heat dissipating device of claim 12, wherein the receiving bracket defines a guiding slot corresponding to the guiding member;

when the receiving bracket is installed to the enclosure, the guiding member slides along the guiding slot to guide the receiving bracket to the predetermined position.

14. The heat dissipating device of claim 9, wherein the vibration absorbing member comprises a buffering portion;

when the receiving bracket vibrates together with the fan, the buffering portion is driven to elastically deformed, and the buffering portion adaptively supports the receiving bracket under restoring force.

15. The heat dissipating device of claim 14, wherein the vibration absorbing member further comprises:

a supporting portion abuts against a side of the receiving bracket;

a second mounting portion located at an end of the supporting portion and mounted to the enclosure;

wherein the buffering portion is fixed to the supporting portion and sandwiched between the supporting portion and the enclosure.

16. The heat dissipating device of claim 15, wherein the second mounting portion defines a sliding slot; the vibration absorbing member is mounted to the enclosure through a fastening member; the fastening member is movably received in the sliding slot.

* * * * *